United States Patent [19]

Shah

[11] Patent Number: 4,531,640
[45] Date of Patent: Jul. 30, 1985

[54] FRAME FOR SUPPORTING CIRCUIT BOARDS

[75] Inventor: Satish C. Shah, San Diego, Calif.

[73] Assignee: Electronic Solutions, San Diego, Calif.

[21] Appl. No.: 531,431

[22] Filed: Sep. 12, 1983

[51] Int. Cl.³ .............................................. A47G 19/08
[52] U.S. Cl. ..................................... 211/41; 211/189; 361/415
[58] Field of Search .......................... 211/41, 184, 189; 361/415

[56] References Cited

U.S. PATENT DOCUMENTS

| | | | |
|---|---|---|---|
| 3,733,523 | 5/1973 | Reynolds et al. | 361/415 |
| 4,068,290 | 1/1978 | Wetherbee | 361/415 |
| 4,261,464 | 4/1981 | Maitland | 211/41 X |
| 4,328,897 | 5/1982 | Weiss | 361/415 X |

FOREIGN PATENT DOCUMENTS

| | | | |
|---|---|---|---|
| 2035704 | 6/1980 | United Kingdom | 361/415 |
| 2067388 | 7/1981 | United Kingdom | 211/189 |

Primary Examiner—Ramon S. Britts
Assistant Examiner—Blair M. Johnson
Attorney, Agent, or Firm—Bruno J. Verbeck; Michael L. Slonecker

[57] ABSTRACT

An improvement to frames for supporting circuit boards is disclosed and includes a circuit board support member controllably positionable within the confines of the frame to support a circuit board which does not run the full length of the frame. The support member permits the use of a single frame to support circuit boards of differing longitudinal dimensions.

4 Claims, 2 Drawing Figures

FRAME FOR SUPPORTING CIRCUIT BOARDS

BACKGROUND OF THE INVENTION

This invention relates to frames of the type used for supporting a plurality of printed circuit boards in closely stacked relationship. Such frames are usually of modular construction and employ a spaced pair of sidewalls and endwalls which define the confines of a volume in which the boards are supported. Typically, a pair of guides, each having a slot extending along their lengthwise dimension, are connected to the endwalls in opposed facing relationship so that a circuit board can be slideably inserted along its opposite edge portions into the slots, thus supporting the board. A plurality of pairs of such guides are usually provided within each frame for supporting several circuit boards in closely spaced, parallel alignment.

A drawback associated with frames of the prior art is that they are generally incapable of supporting circuit boards wherein some of the boards have a longitudinal dimension which is less than the longitudinal dimension for which the frame is designed. As to frames which are capable of supporting various sized circuit boards, this capability is usually obtained by partitioning-off predetermined sections of the frame confines by using a rigid immoveable framework. This oftentimes results in a significant reduction of usable frame volume. Additionally, it often occurs that the partitioned-off portion of the frame is not located in the most desirable position within the frame, thus imposing an unnecessary constraint upon one who wishes to stack circuit boards of differing dimensions in a predetermined arrangement.

Accordingly, it is the primary object of this invention to overcome the foregoing drawback of the prior art by providing an improved circuit board frame which enables the user thereof to support circuit boards of differing longitudinal dimensions at any preselected position within the confines of the frame.

SUMMARY OF THE INVENTION

A support frame for circuit boards is provided which includes a spaced pair of sidewall members and endwall members which define the confines thereof. Connected to the endwall members are a plurality of guide elements which have a slot extending along their longitudinal dimension and are aligned in opposed facing relationship with their respective counterparts mounted on the opposite endwall. The guide elements are spaced apart across the volume of the frame a distance generally corresponding to the longitudinal dimension of a circuit board, and the slots are adapted to slideably receive opposite edge portions of the circuit boards to provide structural support therefor.

In order to support circuit boards of reduced longitudinal dimensions, the frame includes a base member secured to the sidewall members at a position which is intermediate the endwall members and on the side of the frame opposite the side through which circuit boards are inserted, thus avoiding any significant interference with circuit board insertion. Secured to the structural support element is a circuit board support member which extends into the frame confines and includes a guide element adapted to receive an edge portion of a circuit board. The circuit board support element supports the guide element at a position between the endwall members which accounts for the reduced dimension of the circuit board being supported. The circuit board support member may also be positioned at any one of a number of predetermined locations spaced along the longitudinal dimension of the base member, i.e.—along the transverse dimension of the frame.

BRIEF DESCRIPTION OF THE DRAWINGS

So that this invention is more clearly understood, reference is now made to the accompanying drawings wherein like reference numerals refer to like parts throughout the several views, and wherein.

DETAILED DESCRIPTION OF THE PREFERRED EMBODIMENT

Figure 1:
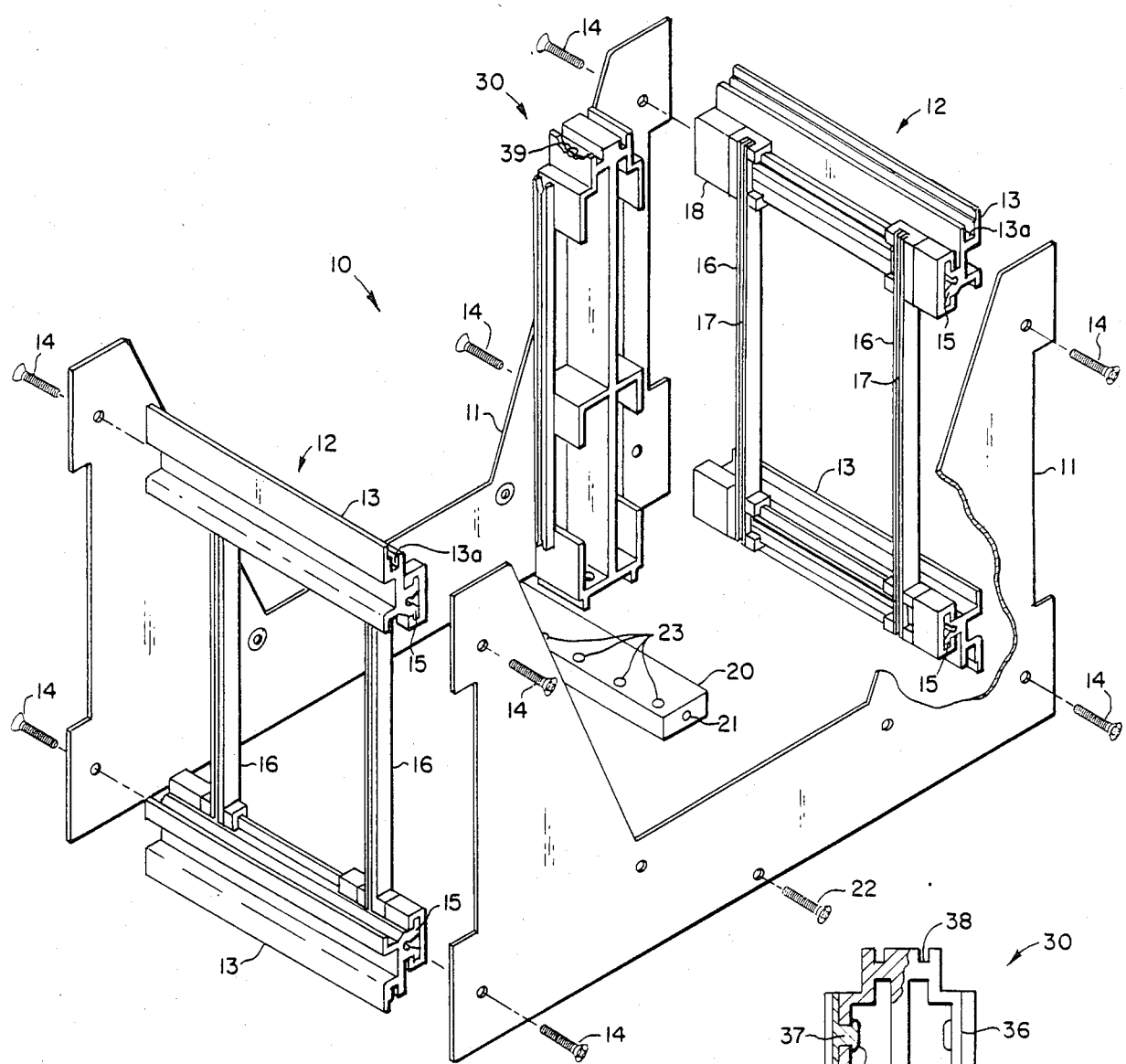
FIG. 1 is an exploded, perspective view of the preferred embodiment of this invention.

Referring to FIG. 1, therein is shown a generally rectangular modular support frame 10 comprising a spaced pair of sidewall members 11 and a spaced pair of endwall members 12. In the preferred embodiment endwall members 12 each comprise a vertically spaced pair of cross-members 13 secured to sidewall members 11 by any suitable fastening means such as screws 14 or the like. Formed along the longitudinal dimension of each member 13 is a mounting element 15 adapted to retain thereon one end of a circuit board guide element 16. Each element 16 includes a slot 17 which extends along the length thereof and is suitably dimensioned to slideably receive and support an edge portion of a circuit board (not shown). Spacer elements 18 may be mounted on elements 15 between adjacent guide elements 16 to permit control of the spacing between adjacent circuit boards.

As thus far described it will be appreciated that the preferred embodiment is substantially similar to prior art support frames and is capable of supporting only circuit boards having identical longitudinal dimensions. The discussion which follows describes the structural features added to the frame which gives it the capability to support circuit boards of reduced longitudinal dimensions.

In accordance with the practice of this invention frame 10 includes a base member 20 which is transversely secured to sidewall members 11 at a position intermediate endwall members 12 and on the side of frame 10 opposite the side through which circuit boards are inserted into the frame. Means for securing member 20 in the foregoing manner may take the form of a threaded recess 21 located at each end of member 20 and a screw 22 threadably engagable with recess 21. A plurality of threaded recesses 23 are disposed into member 20 and spaced apart at predetermined locations along the length thereof.

Figure 2:
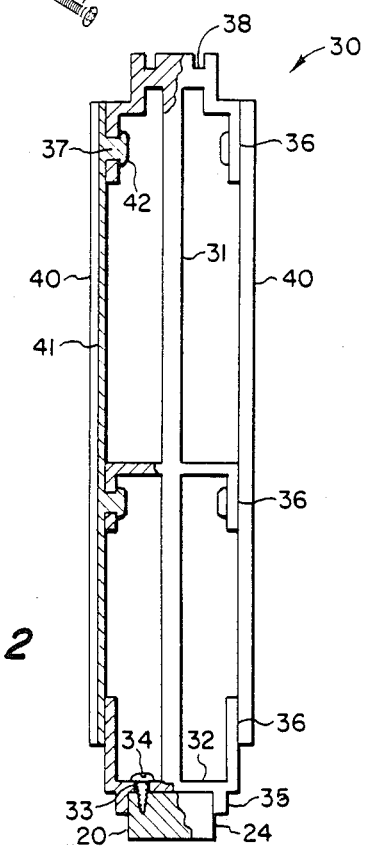
FIG. 2 is a partially cut-away, side view of the preferred embodiment of means for supporting circuit boards of reduced dimensions within the frame shown in FIG. 1.

Projecting upwardly from member 20 into the interior of the confines of frame 10 wherein the circuit boards are supported is a circuit board support member 30 which is best understood by reference to FIG. 2. Member 30 preferably includes an upright vertical or body element 31 having a foot 32 which extends outwardly for support upon member 20. An aperture 33 is provided through foot 32 for registration with recesses 23 and for receiving any means suitable for connecting members 20 and 30, such as screws 34 or the like. Projecting downwardly from foot 32 is a flange 35 adapted for cooperable abutment with vertical edge 24 of member 20, flange or shoulder 35 thus preventing member 30 from rotating.

A guide element 40, having a slot 41 along the length thereof, is provided in association with element 30 to slideably receive the edge portion of a circuit board which is supported at its opposite end by a guide element 16 mounted to an endwall member 12. In the preferred embodiment member 30 is provided with a plurality of stand-off portions 36 which provide structural support for guide element 40, at least some of portions 36 having a aperture 37. Guide element 40 is preferably formed from flexible plastic material and preferrably includes deformable fastening means 42 extending outwardly from the rear thereof and engageable with portions 36 through apertures 37. Disposed across the top of element 30 is a slot 38 which corresponds to a similar slot 13a included along the length of members 13. Disposed along slots 13a and 38 are a plurality of threaded recesses 39 (FIG. 1) which permit the user of frame 10 to use any suitable fastener to more firmly secure supported circuit boards to the frame.

Based upon the foregoing it will be appreciated that disclosed herein is a new and useful frame for supporting circuit boards which is readily adaptable to permit the support of boards of differing longitudinal dimensions at any predetermined position within the confines of the frame. While the invention has been described with respect to the preferred form thereof, it will be readily appreciated that various changes can be made thereto without departing from the spirit and scope of the invention. For example, any element similar to member 30 which is supportable within the confines of frame 10 in such a manner as to avoid interference with the slideable insertion of circuit boards will work with equal facility. Accordingly, all such changes are contemplated as may come within the scope of the appended claims.

What is claimed is:

1. Apparatus for supporting a circuit board of reduced longitudinal dimension within the confines of a frame of greater longitudinal dimension, comprising a circuit board support member, a guide element mounted on said circuit board support member and adapted to receive a marginal edge portion of said circuit board, a base member, a foot element extending outwardly from one end of said circuit board support member and mounted upon a surface portion of a side of said base member, and a shoulder member extending outwardly from said foot element and in abutting engagement with said base member on the side thereof adjacent the side upon which said foot element is mounted whereby to permit said circuit board support member to be mounted without rotation upon said base member, said apparatus not limiting the longitudinal dimension of other circuit boards supportable within said frame adjacent either side of said circuit board.

2. Apparatus as set forth in claim 1, further comprising fastening means on said guide element for removeably securing said guide element to said circuit board support member.

3. Apparatus for supporting a circuit board of reduced longitudinal dimension within the confines of a frame of greater longitudinal dimension, comprising a circuit board support member including a body element, a stand-off element extending outwardly from a side of said body element, and a guide element mounted on said stand-off element in spaced apart relationship with said body element, said guide element being adapted to receive a marginal edge portion of said circuit board, said apparatus not limiting the longitudinal dimension of other circuit boards supportable within said frame adjacent either side of said circuit board, said apparatus further comprising a base member, a foot element extending outwardly from one end of said circuit board support member and mounted upon a surface portion of a side of said base member, and a shoulder element extending outwardly from said foot element and in abutting engagement with said base member on the side thereof adjacent the side upon which said foot element is mounted whereby to permit said circuit board support member to be mounted without rotation upon said base member.

4. Apparatus for supporting a circuit board of reduced longitudinal dimension within the confines of a frame of greater longitudinal dimension, comprising a circuit board support member including a body element, a stand-off element extending outwardly from a side of said body element, and a guide element mounted on said stand-off element in spaced apart relationship with said body element, said guide element being adapted to receive a marginal edge portion of said circuit board, said apparatus not limiting the longitudinal dimension of other circuit boards supportable within said frame adjacent either side of said circuit board, said apparatus further comprising fastening means on said guide element for removably securing said guide element to said stand-off element.

* * * * *